US009929171B2

United States Patent
Aoyama

(10) Patent No.: US 9,929,171 B2
(45) Date of Patent: Mar. 27, 2018

(54) SEMICONDUCTOR MEMORY DEVICE AND METHOD OF MANUFACTURING THE SAME

(71) Applicant: TOSHIBA MEMORY CORPORATION, Minato-ku (JP)

(72) Inventor: Kenji Aoyama, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/241,599

(22) Filed: Aug. 19, 2016

(65) Prior Publication Data

US 2017/0263624 A1    Sep. 14, 2017

Related U.S. Application Data

(60) Provisional application No. 62/305,255, filed on Mar. 8, 2016.

(51) Int. Cl.
*H01L 27/11582* (2017.01)
*H01L 27/11568* (2017.01)
(Continued)

(52) U.S. Cl.
CPC .. *H01L 27/11582* (2013.01); *H01L 27/11521* (2013.01); *H01L 27/11556* (2013.01);
(Continued)

(58) Field of Classification Search
CPC .................. H01L 27/11556; H01L 2924/1438
See application file for complete search history.

(56) References Cited

U.S. PATENT DOCUMENTS

2014/0035026 A1   2/2014 Jang et al.
2014/0070302 A1*  3/2014 Yoo ............... H01L 27/1157
257/324

(Continued)

FOREIGN PATENT DOCUMENTS

JP    2014-33201    2/2014
JP    2014-57067    3/2014
JP    2014-57068    3/2014

OTHER PUBLICATIONS

"Remote Plasma-Enhanced CVD of Silicon: as a Function of Growth Parameters" on Journal of Electronic Materials, vol. 19, No. 10, 1990 by Anthony.*

*Primary Examiner* — Moazzam Hossain
*Assistant Examiner* — Farun Lu
(74) *Attorney, Agent, or Firm* — Oblon, McClelland, Maier & Neustadt, L.L.P.

(57) ABSTRACT

A semiconductor memory device according to an embodiment comprises: a semiconductor substrate; a semiconductor layer provided extending in a first direction above the semiconductor substrate, on the semiconductor substrate; a first insulating layer provided on a side surface of the semiconductor layer; a charge accumulation layer provided on a side surface of the first insulating layer; a block insulating layer provided on a side surface of the charge accumulation layer; and a plurality of conductive layers stacked in the first direction via an insulating layer, in a periphery of the block insulating layer. The block insulating layer includes: a first block insulating layer; and a second block insulating layer that has a permittivity which is higher than that of the first block insulating layer. A lower end of the second block insulating layer is positioned more upwardly than a lower end of the first insulating layer.

15 Claims, 15 Drawing Sheets

(51) Int. Cl.
    *H01L 27/11521*     (2017.01)
    *H01L 27/11556*     (2017.01)
    *G11C 16/26*     (2006.01)
    *G11C 16/08*     (2006.01)

(52) U.S. Cl.
    CPC ........ *H01L 27/11568* (2013.01); *G11C 16/08* (2013.01); *G11C 16/26* (2013.01)

(56) References Cited

U.S. PATENT DOCUMENTS

2014/0073099 A1    3/2014    Park et al.
2016/0225866 A1*    8/2016    Peri .................. H01L 29/66833

* cited by examiner

SEMICONDUCTOR MEMORY DEVICE AND METHOD OF MANUFACTURING THE SAME

CROSS REFERENCE TO RELATED APPLICATION

This application is based upon and claims the benefit of priority from U.S. Provisional Patent Application No. 62/305,255, filed on Mar. 8, 2016, the entire contents of which are incorporated herein by reference.

FIELD

Embodiments described herein relate to a semiconductor memory device and a method of manufacturing the same.

BACKGROUND

A flash memory that stores data by accumulating a charge in a charge accumulation layer or floating gate, is known. Such a flash memory is connected by a variety of systems, such as NAND type or NOR type, and configures a semiconductor memory device. In recent years, increasing of capacity and raising of integration level of such a semiconductor memory device have been proceeding. Moreover, a semiconductor memory device in which memory cells are disposed three-dimensionally (a three-dimensional type semiconductor memory device) has been proposed to achieve increased capacity and raised integration level of the semiconductor memory device. In addition, it is also being required that both increased capacity and miniaturization are achieved.

DETAILED DESCRIPTION

Figure 1:
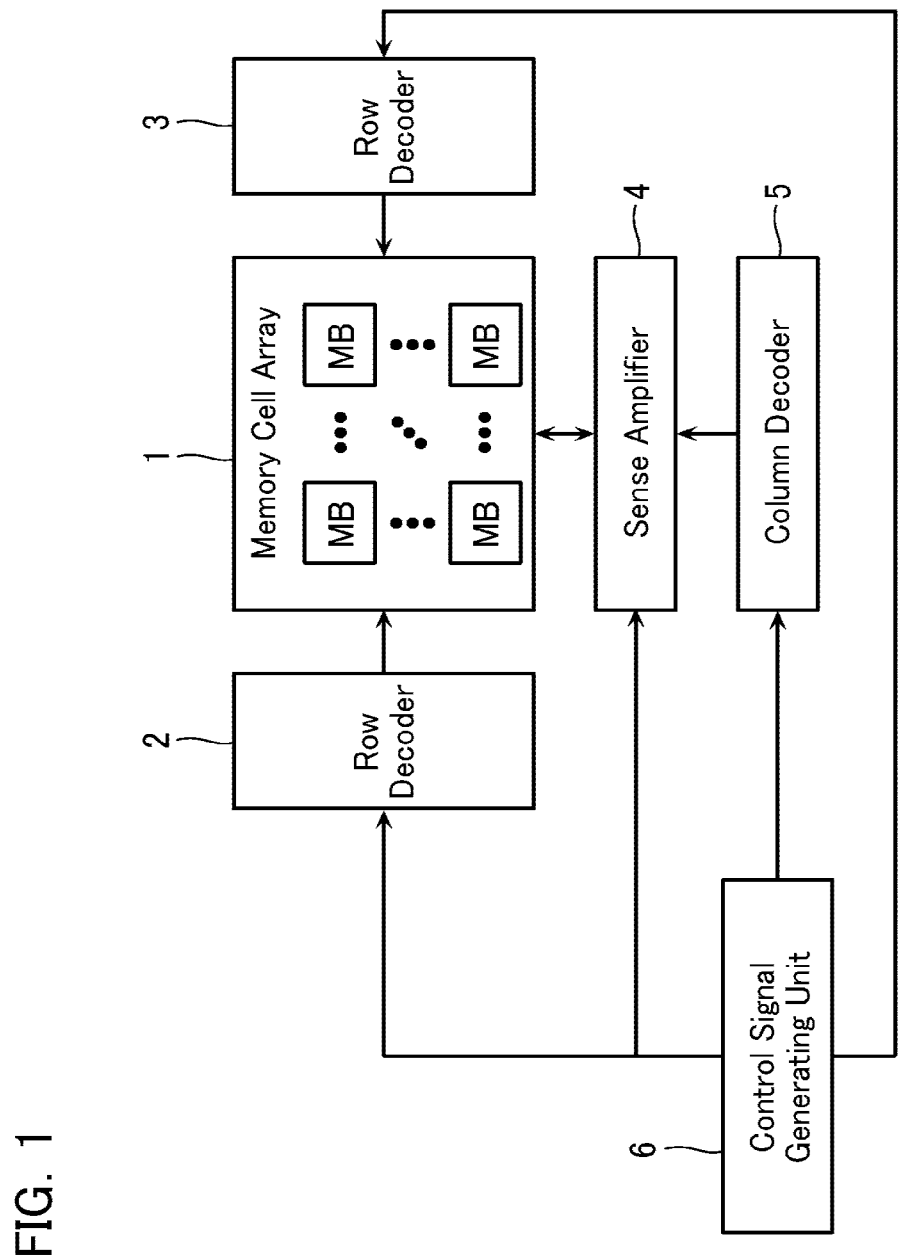
FIG. 1 is a functional block diagram showing a schematic configuration of a semiconductor memory device according to a first embodiment.

A semiconductor memory device according to an embodiment comprises: a semiconductor substrate; a semiconductor layer provided extending in a first direction directed above the semiconductor substrate, on the semiconductor substrate; a first insulating layer provided on a side surface of the semiconductor layer; a charge accumulation layer provided on a side surface of the first insulating layer; a block insulating layer provided on a side surface of the charge accumulation layer; and a plurality of conductive layers stacked in the first direction via an insulating layer, in a periphery of the block insulating layer. The block insulating layer includes: a first block insulating layer; and a second block insulating layer that has a permittivity which is higher than that of the first block insulating layer. A lower end of the second block insulating layer is positioned more upwardly than a lower end of the first insulating layer.

First Embodiment

[Configuration]

Next, semiconductor memory devices according to embodiments will be described in detail with reference to the drawings. Note that these embodiments are merely examples. For example, each of the drawings of the semiconductor memory devices employed in the embodiments below is schematic, and thicknesses, widths, ratios, and so on, of layers are not necessarily identical to those of the actual semiconductor memory devices.

Moreover, the embodiments below relate to semiconductor memory devices having a structure in which a plurality of MONOS (Metal-Oxide-Nitride-Oxide-Semiconductor) type memory cells (transistors) are stacked along a direction intersecting a surface of a substrate (a Z direction in the drawings referred to hereafter), on the substrate, each of the MONOS type memory cells including: a semiconductor film acting as a channel provided in a column shape in the Z direction; and a gate electrode film provided, via a charge accumulation layer, on a side surface of the semiconductor film. However, the memory cell may be a memory cell of another form, for example, a SONOS (Semiconductor-Oxide-Nitride-Oxide-Semiconductor) type memory cell or MANOS (Metal-Aluminum Oxide-Nitride-Oxide-Semiconductor) type memory cell, or a floating gate type memory cell.

First Embodiment

FIG. 1 is a functional block diagram showing a configuration of a semiconductor memory device according to a first embodiment. The semiconductor memory device according to the embodiment comprises: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory cells MC (not illustrated; mentioned later in FIG. 3) arranged three-dimensionally therein. The row decoders 2 and 3 decode a downloaded block address signal, and so on, and control a write operation and a read operation of data of the memory cell array 1. The sense amplifier 4 detects and amplifies an electrical signal flowing in the memory cell array 1 during the read operation. The column decoder 5 decodes a column address signal and controls the sense amplifier 4. The control signal generating unit 6, in addition to boosting a reference voltage and generating a voltage employed during write, erase or the read operation, generates a control signal and controls the row decoders 2 and 3, the sense amplifier 4, and the column decoder 5.

Figure 2:
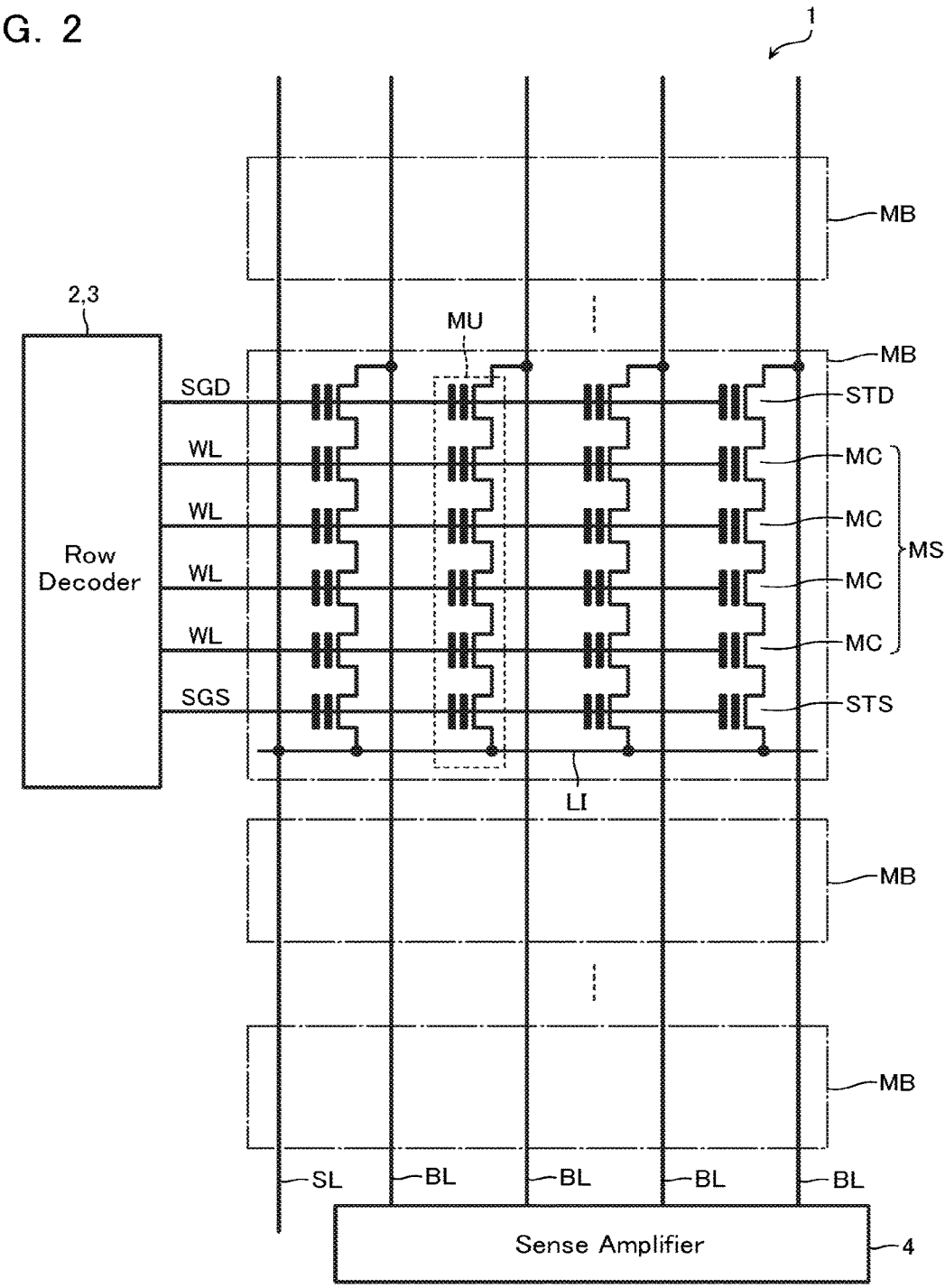
FIG. 2 is an equivalent circuit diagram showing a configuration of a memory cell array 1 of the same semiconductor memory device.

FIG. 2 is an equivalent circuit diagram showing a configuration of part of the memory cell array 1 according to the present embodiment.

The memory cell array 1 according to the present embodiment comprises the plurality of memory blocks MB. Moreover, a plurality of bit lines BL and a source line SL are commonly connected to these plurality of memory blocks MB. Each of the memory blocks MB is connected to the sense amplifier via the bit line BL and to an unillustrated source line driver via the source line SL.

The memory block MB comprises a plurality of memory units MU each having its one end connected to the bit line BL and having its other end connected, via a source contact LI, to the source line SL.

The memory unit MU comprises a plurality of the memory cells MC connected in series. As will be mentioned later, the memory cell MC comprises: a semiconductor layer; a charge accumulation layer; and a control gate. In addition, during various operations, a charge is accumulated in the charge accumulation layer (write operation), moreover, a charge is eliminated from the charge accumulation layer (erase operation), based on a voltage applied to the control gate, whereby a threshold value of the memory cell MC is changed. Data stored in the memory cell MC is determined (read operation) by detecting a magnitude of this threshold value. Note that hereafter, the plurality of memory cells MC connected in series will be called a "memory string MS".

Commonly connected to the control gates of pluralities of the memory cells MC configuring different memory strings MS are, respectively, word lines WL. These pluralities of memory cells MC are connected to the row decoder via the word lines WL.

The memory unit MU comprises a drain side select gate transistor STD connected between the memory string MS and the bit line BL. Connected to a control gate of the drain side select gate transistor STD is a drain side select gate line SGD. The drain side select gate line SGD is connected to the row decoder and selectively connects the memory string MS and the bit line BL based on an inputted signal.

The memory unit MU comprises a source side select gate transistor STS connected between the memory string MS and the source contact LI. Connected to a control gate of the source side select gate transistor STS is a source side select gate line SGS. The source side select gate line SGS is connected to the row decoder and selectively connects the memory string MS and the source line SL based on an inputted signal.

Figure 3:
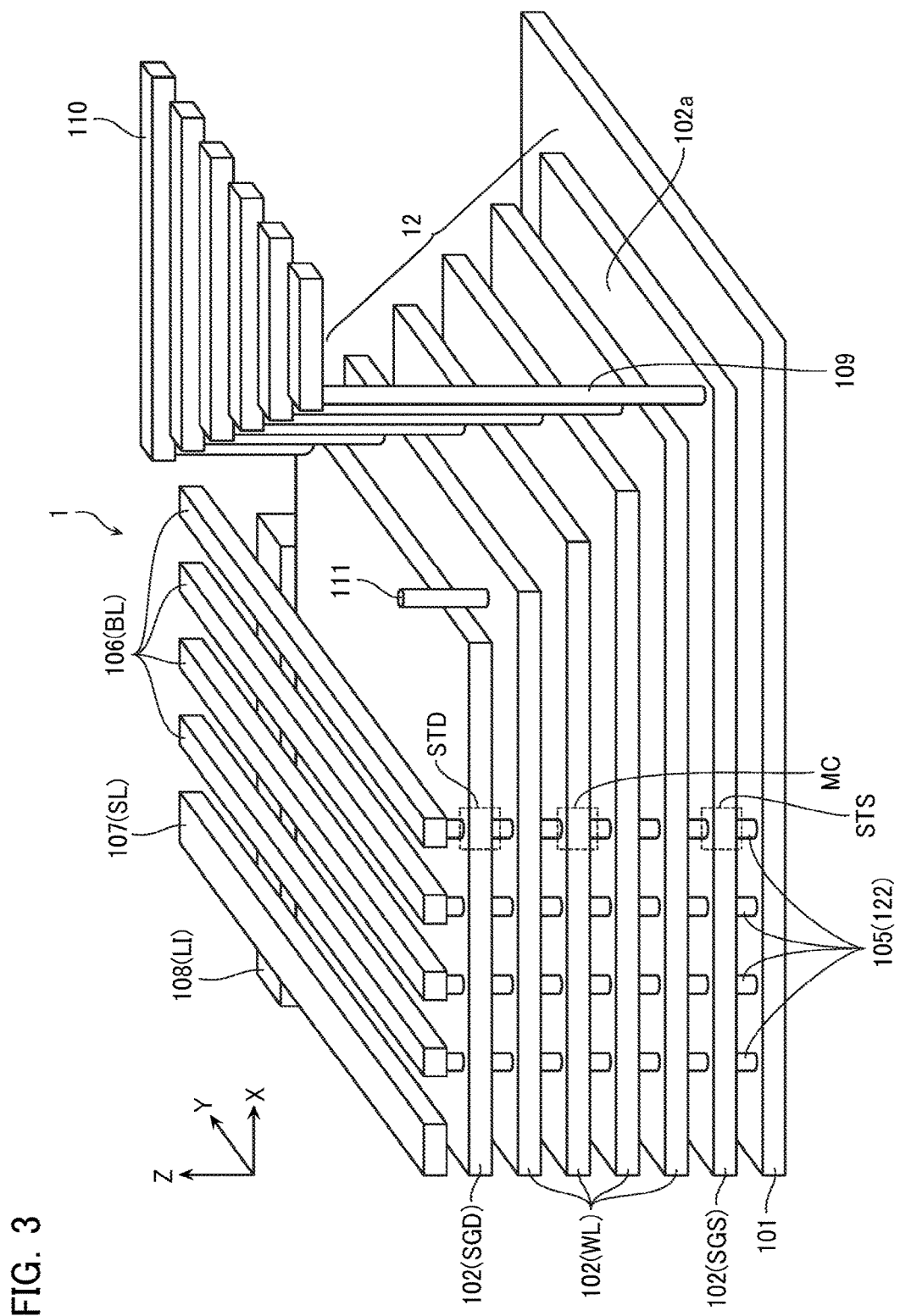
FIG. 3 is a perspective view showing a configuration of the memory cell array 1 of the same semiconductor memory device.

FIG. 3 is a schematic perspective view showing a configuration of part of the memory cell array 1. Note that in FIG. 3, in order to explain mainly a principal portion of the memory cell array 1, such as a conductive layer, part of the configuration, such as an insulating layer, is omitted.

The memory cell array 1 according to the present embodiment comprises: a substrate 101; and a plurality of conductive layers 102 stacked in the Z direction, via an unillustrated inter-layer insulating layer, on the substrate 101. In addition, the memory cell array 1 includes a plurality of memory columnar bodies 105 extending in the Z direction. An intersection of the conductive layer 102 and the memory columnar body 105 functions as the source side select gate transistor STS, the memory cell MC, or the drain side select gate transistor STD. The conductive layer 102 is configured from a conductive layer of the likes of tungsten (W) or polysilicon, for example, and functions as the word line WL, the source side select gate line SGS, and the drain side select gate line SGD.

A conductive layer 106 functioning as the bit line BL and a conductive layer 107 functioning as the source line SL are disposed above the conductive layer 102.

The memory cell array 1 comprises a conductive layer 108 that faces side surfaces in a Y direction of the plurality of conductive layers 102 and extends in an X direction. A lower surface of the conductive layer 108 contacts the substrate 101. The conductive layer 108 is configured from a conductive layer of the likes of tungsten (W), for example, and functions as the source contact LI.

The plurality of conductive layers 102 are formed in a stepped shape at their ends in the X direction and configure a stepped part 12.

A contact part 102a is formed at an extremity of each step configuring the stepped part 12. A contact 109 is disposed in the contact part 102a. The contact 109 is connected to an upper wiring line 110. Moreover, the stepped part 12 may comprise a support 111 that extends in the Z direction to penetrate a stepped structure 12. The support 111 functions to maintain a posture of a stacked structure of the memory cell array 1 in a later-described step for replacing a sacrifice layer with a conductive layer. To simplify explanation, only one support 111 is shown, but a plurality of supports 111 may be provided.

Figure 4:
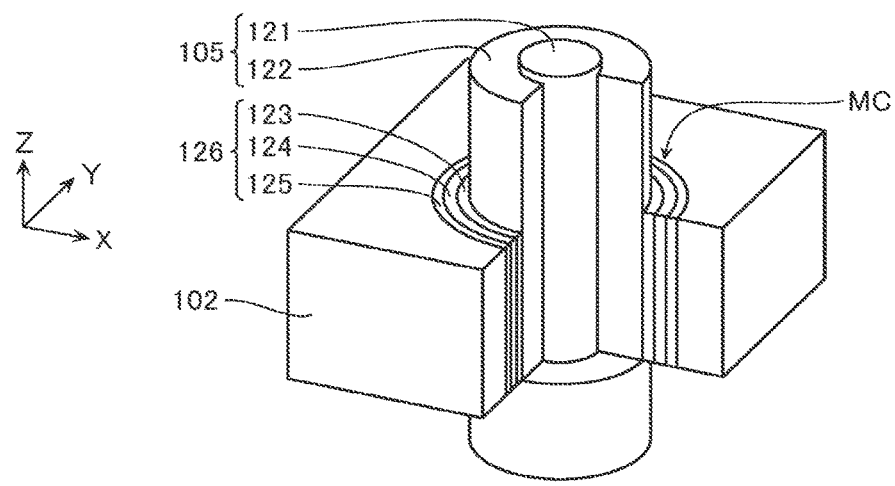
FIG. 4 is a schematic perspective cross-sectional view showing an example of configuration of one memory cell MC included in the same semiconductor memory device.

FIG. 4 is a schematic perspective view showing a configuration of the memory cell MC. Note that FIG. 4 shows the configuration of the memory cell MC, but the source side select gate transistor STS and the drain side select gate transistor STD may also be configured similarly to the memory cell MC. Moreover, in FIG. 4, in order to explain mainly a principal configuration of the memory cell MC, such as a conductive layer, a memory layer, or a semiconductor layer, part of the configuration, such as an insulating layer disposed above/below the conductive layer 102 or a barrier metal layer, is omitted.

The memory cell MC is provided so as to extend in the Z direction, at an intersection of the conductive layer 102 and the memory columnar body 105. The memory columnar body 105 comprises: a core insulating layer 121; and a semiconductor layer 122. The semiconductor layer 122 covers a sidewall of the core insulating layer 121. A memory film 126 is provided on a side surface of the semiconductor layer 122. The memory film 126 includes: a tunnel insulating layer 123 provided on a side surface of the semiconductor layer 122; a charge accumulation layer 124 provided on a side surface of the tunnel insulating layer 123; and a block insulating layer 125 provided on a side surface of the charge accumulation layer 124. Moreover, the conductive layer 102 is provided in a periphery of the block insulating layer 125.

The core insulating layer 121 is configured from an insulating layer of the likes of silicon oxide, for example. The semiconductor layer 122 is configured from a semiconductor layer of the likes of polysilicon, for example. Moreover, the semiconductor layer 122 functions as a channel body of the memory cell MC, the source side select gate transistor STS, and the drain side select gate transistor STD. The tunnel insulating layer 123 is configured from an insulating layer of the likes of silicon oxide, for example. The charge accumulation layer 124 is configured from an insulating layer capable of accumulating a charge, of the likes of silicon nitride, for example. The block insulating layer 125 is configured from, for example, silicon oxide or from a metal oxide such as hafnium oxide, aluminum oxide, zirconium oxide, titanium oxide, or tantalum oxide whose permittivity is higher than that of silicon oxide, or from a stacked body of these.

Figure 5:
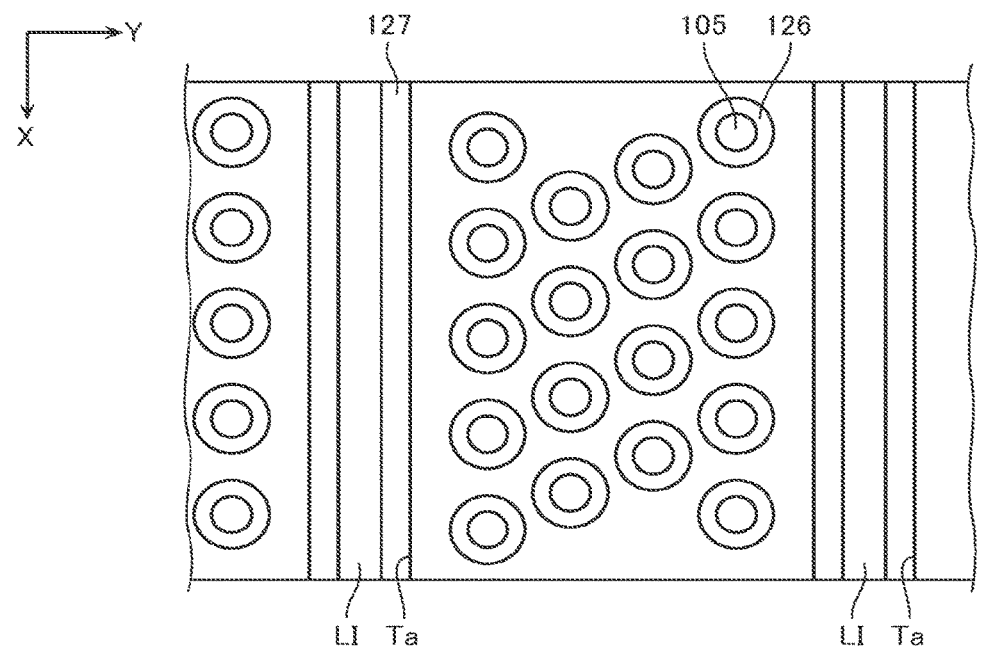
FIG. 5 is a plan view showing a configuration of part of the memory cell array 1 included in the same semiconductor memory device.
Figure 6:
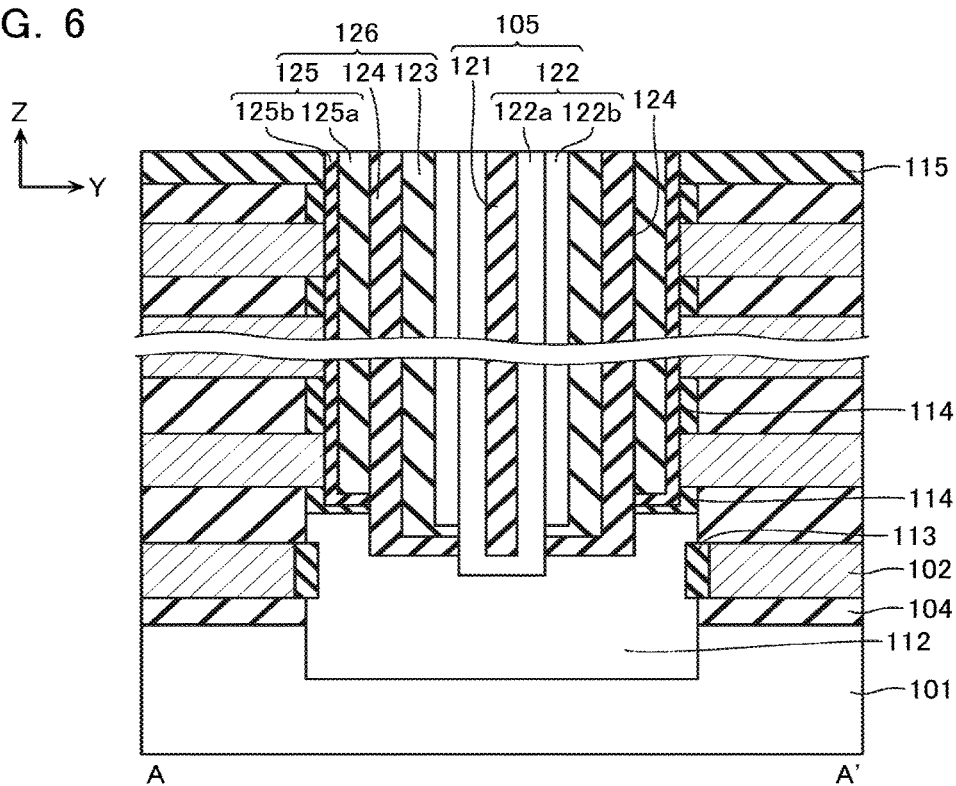
FIG. 6 is a schematic cross-sectional view showing a configuration of the same semiconductor memory device.

Next, the configuration of the semiconductor memory device according to the present embodiment will be described in more detail with reference to FIGS. 5 and 6. FIG. 5 is a plan view showing a configuration of part of the memory cell array 1; and FIG. 6 is a cross-sectional view along the Y direction (cross-sectional view taken along the line A-A' of FIG. 5) of the memory cell array 1. Moreover, in FIG. 6, part of the configuration, such as the upper wiring line, is omitted.

As shown in FIG. 5, in the present embodiment, the memory columnar bodies 105 are arranged staggered. Moreover, the source contact LI is formed in a striped shape having the X direction as its longitudinal direction. This source contact LI is implanted, via an inter-layer insulating film 127, in a trench Ta that divides the memory cell array 1 in a block unit.

As shown in FIG. 6, in the memory cell array 1 of the present embodiment, the substrate 101 which is configured from silicon has an epitaxial layer 112 provided thereon. The epitaxial layer 112 is configured from epitaxial silicon caused by solid phase growth from the substrate 101.

The above-mentioned memory columnar body 105 and memory film 126 are provided on the epitaxial layer 112.

In the present embodiment, the semiconductor layer 122 is configured from: a first semiconductor layer 122a extending in the Z direction; and a second semiconductor layer 122b that covers a side surface of the first semiconductor layer 122a and whose lower end is positioned more upwardly than a lower end of the first semiconductor layer 122a. Such a configuration is due to a later-described method of manufacturing according to the present embodiment. Moreover, sometimes, as a result of that method of manufacturing, a natural oxide film occurs on a surface on a second semiconductor layer 122b side of the first semiconductor layer 122a. Hence, oxygen atoms are sometimes included at an interface of the first semiconductor layer 122a and the second semiconductor layer 122b.

The tunnel insulating layer 123 is provided on the side surface of the semiconductor layer 122. This tunnel insulating layer 123 forms a bottom part extending toward the semiconductor layer 122 and over part of a region of the epitaxial layer 112. A lower end of this bottom part is positioned between the lower end of the first semiconductor layer 122a and the lower end of the second semiconductor layer 122b. As a result, there is a structure in which the bottom part of the tunnel insulating layer 123 contacts a side surface of the first semiconductor layer 122a and a bottom surface of the second semiconductor layer 122b.

The charge accumulation layer 124 is provided further on the side surface of the tunnel insulating layer 123 on the second semiconductor layer 122b. This charge accumulation layer 124 also forms a bottom part extending toward the semiconductor layer 122 and over part of a region of the epitaxial layer 112. A lower end of this bottom part is positioned between a lower end of the tunnel insulating layer 123 and the lower end of the first semiconductor layer 122a. As a result, the bottom part of the charge accumulation layer 124 contacts the side surface of the first semiconductor layer 122a and a bottom surface of the tunnel insulating layer 123.

In the present embodiment, the block insulating layer 125 is configured from: a first block insulating layer 125a covering the side surface of the charge accumulation layer 124; and a second block insulating layer 125b covering a side surface of the first block insulating layer 125a. A bottom part of the second block insulating layer 125b projects in a direction directed to the semiconductor layer 122 and has its lower end positioned between a lower end of the first block insulating layer 125a and the lower end of the charge accumulation layer 124. In other words, a lower end of the block insulating layer 125 is positioned more upwardly than the lower end of the charge accumulation layer 124. Furthermore, the lower end of the block insulating layer 125 is positioned more upwardly than the lower end of the tunnel insulating layer 123.

By such a configuration, both the first block insulating layer 125a and the second block insulating layer 125b have a creepage distance to the semiconductor layer 122 sufficiently secured, and never directly contact the semiconductor layer 122.

Now, in the present embodiment, permittivity of the second block insulating layer 125b is configured higher than that of the first block insulating layer 125a. For example, the first block insulating layer 125a adopts silicon oxide (permittivity=approximately 3.9), and the second block insulating layer 125b adopts the above-mentioned metal oxide (the likes of hafnium oxide, aluminum oxide, zirconium oxide, titanium oxide, or tantalum oxide).

As mentioned above, semiconductor memory devices of recent years are being required to achieve both increased capacity and miniaturization. Therefore, the word line WL, and so on, tends to undergo film thinning. On the other hand, when the word line WL undergoes film thinning, a resistance (R) of the word line WL rises, hence a time constant (RC) increases. When the time constant increases, there is a risk that rise and fall of cell current slow, leading to a deterioration of device characteristics.

In order to avoid such a risk, the following configuration is being adopted, that is, a configuration where a high permittivity insulating layer, in other words, a so-called High-k film, which is part of the block insulating layer, is provided not on a side surface of the word line WL, but in a memory hole (in FIG. 6, a region where the memory columnar body 105 and the memory film 126 are disposed).

In the case of such a configuration, the High-k film and silicon of the semiconductor layer sometimes end up contacting each other. Now, comparing oxide generating energy of silicon and the above-mentioned metals such as hafnium or aluminum, silicon is known to be more stable and less easily oxidized.

Therefore, theoretically, even if the High-k film which is a metal oxide film and silicon contact each other, the silicon is never oxidized.

However, in reality, it happens that due to unreacted residual oxygen and metal in the High-k film, an oxide of metal and silicon such as silicon oxide ($SiO_2$) or $AlSiO_x$ gets generated.

For the above kind or reason, when the High-k film and silicon contact each other, there is a risk that due to the likes of a post-heating step and electrical stress, an oxidation reaction proceeds, part of the semiconductor layer ends up being silicated, the resistance rises, and a sufficient cell current becomes unobtainable (there is a risk of Icell deterioration).

However, due to the second block insulating layer 125b, that is, a high permittivity layer, of the block insulating layer 125 not directly contacting the semiconductor layer 122 as in the present embodiment, silication of the semiconductor layer 122 can be prevented and Icell deterioration can be avoided.

The plurality of conductive layers 102 are stacked in the Z direction, via an inter-layer insulating layer 104, in a periphery of the epitaxial layer 112 and the block insulating layer 125. A hard mask 115 is provided on the uppermost layer inter-layer insulating layer 104.

Note that an upper surface of the epitaxial layer 112 is positioned between an upper surface of the first of the conductive layers 102 and a lower surface of the second of the conductive layers 102 counting from the substrate 101. Moreover, a surface of the epitaxial layer 112 has a stepped shape whose height becomes lower from an outer side to an inner side, corresponding to positions of the lower end of the semiconductor layer 122, the lower end of the charge accumulation layer 124, and the lower end of the block insulating layer 125.

In addition, a side surface of the epitaxial layer 112 faces the first of the conductive layers 102 counting from the substrate (the lowermost layer conductive layer 102), and an oxide film 113 is provided between the epitaxial layer 112 and that semiconductor layer 102.

Moreover, upward of the epitaxial layer 112, a cover film 114 is provided between the inter-layer insulating layer 104 and the block insulating layer 125. These oxide film 113 and cover film 114 are provided by the later-mentioned method of manufacturing.

[Method of Manufacturing]

The method of manufacturing according to the present embodiment will be described using FIGS. 7 to 16.

Figure 7:
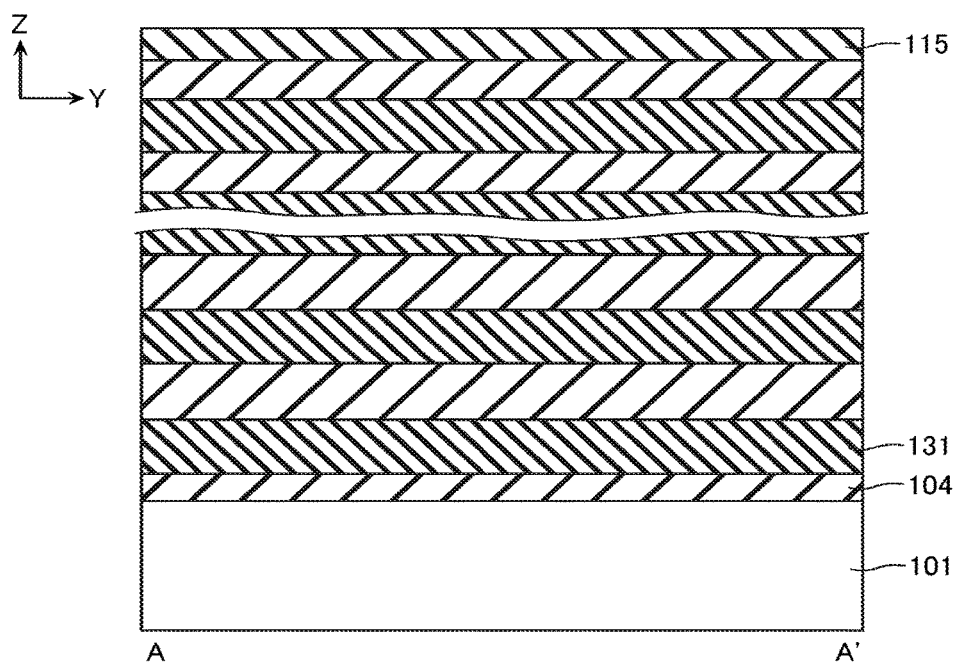
FIGS. 7 to 16 are schematic cross-sectional views showing a method of manufacturing the same semiconductor memory device.

As shown in FIG. 7, a plurality of the inter-layer insulating layers 104 and sacrifice layers 131 are stacked alternately on the semiconductor substrate 101. The hard mask 115 is deposited on an upper surface of the uppermost layer inter-layer insulating layer 104. The sacrifice layer 131 is configured from silicon nitride, for example. The hard mask 115 may be configured from amorphous silicon or zinc oxide (ZnOx), for example. This hard mask 115 functions to protect an upper part of the memory columnar body 105 formed in a later step.

Figure 8:
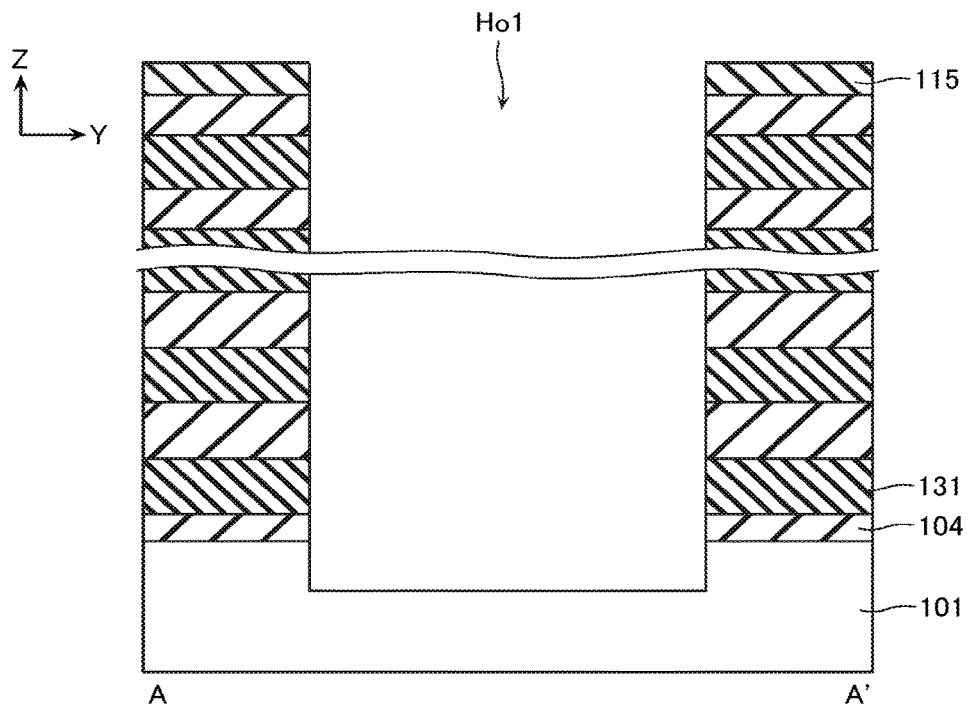

As shown in FIG. 8, patterning of a desired pattern corresponding to a memory hole is performed by lithography, and a first hole Ho1 (memory hole) is formed by RIE or wet etching. At this time, a surface of the substrate 101 sometimes gets shaved.

Figure 9:
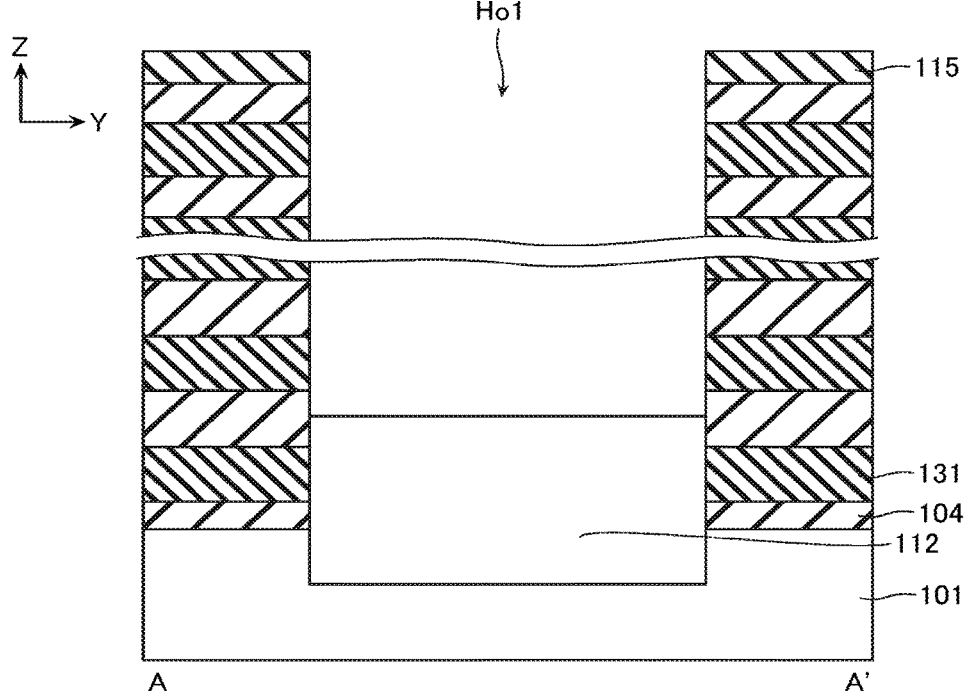

As shown in FIG. 9, the semiconductor substrate 101 exposed by formation of the first hole Ho1 is caused to undergo selective growth using the likes of a gas including silicon to form the epitaxial layer 112.

Figure 10:
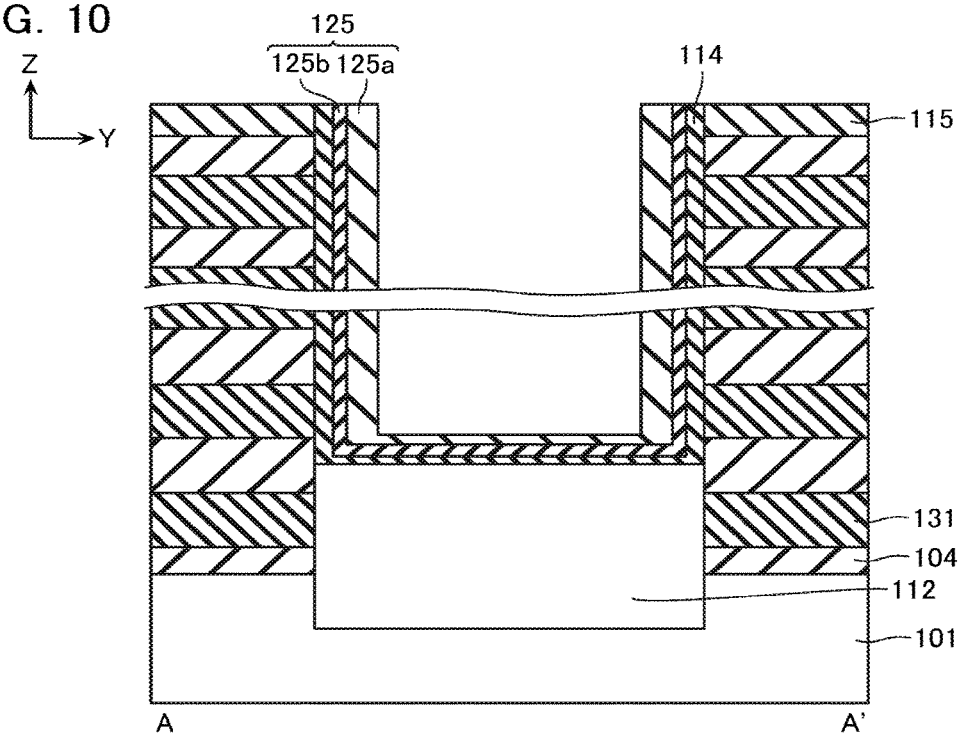

As shown in FIG. 10, the cover film 114, the second block insulating layer 125b, and the first block insulating layer 125a are sequentially deposited. The cover film 114 functions as a stopper when the sacrifice layer 131 is removed by a phosphoric acid-based solution in a later step. Therefore the cover film 114 is configured from a material having a high selectivity with respect to phosphoric acid, for example, silicon oxide or silicon.

Figure 11:
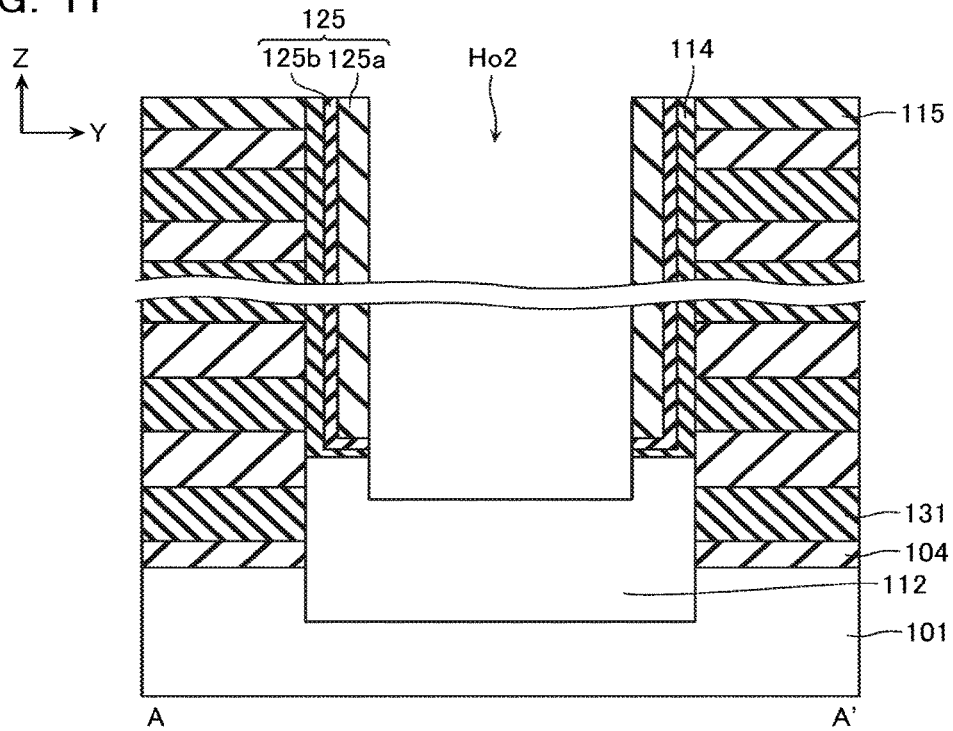

As shown in FIG. 11, parts of the cover film 114, the second block insulating layer 125b, and the first block insulating layer 125a in a bottom part of the first hole Ho1 are removed by RIE or wet etching. At this time, the surface of the epitaxial layer 112 sometimes gets shaved, similarly to in the step of FIG. 8. In this way, a second hole Ho2 is formed.

Figure 12:
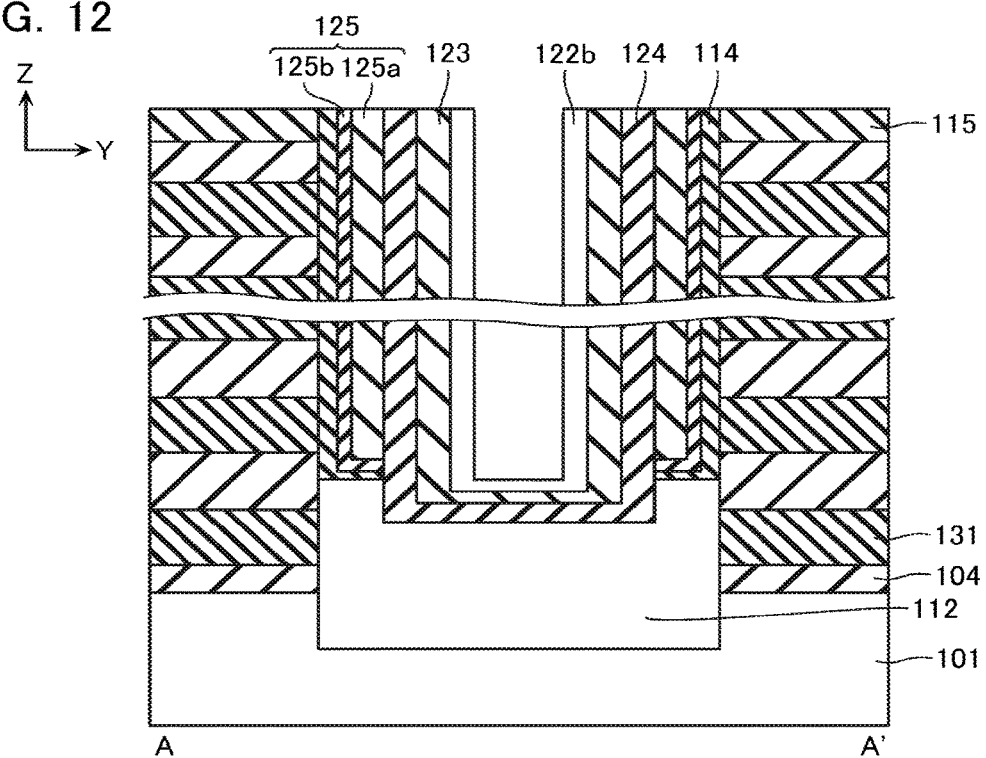

As shown in FIG. 12, the charge accumulation layer 124, the tunnel insulating layer 123, and the second semiconductor layer 122b are sequentially deposited along an inner wall of the second hole Ho2.

Figure 13:
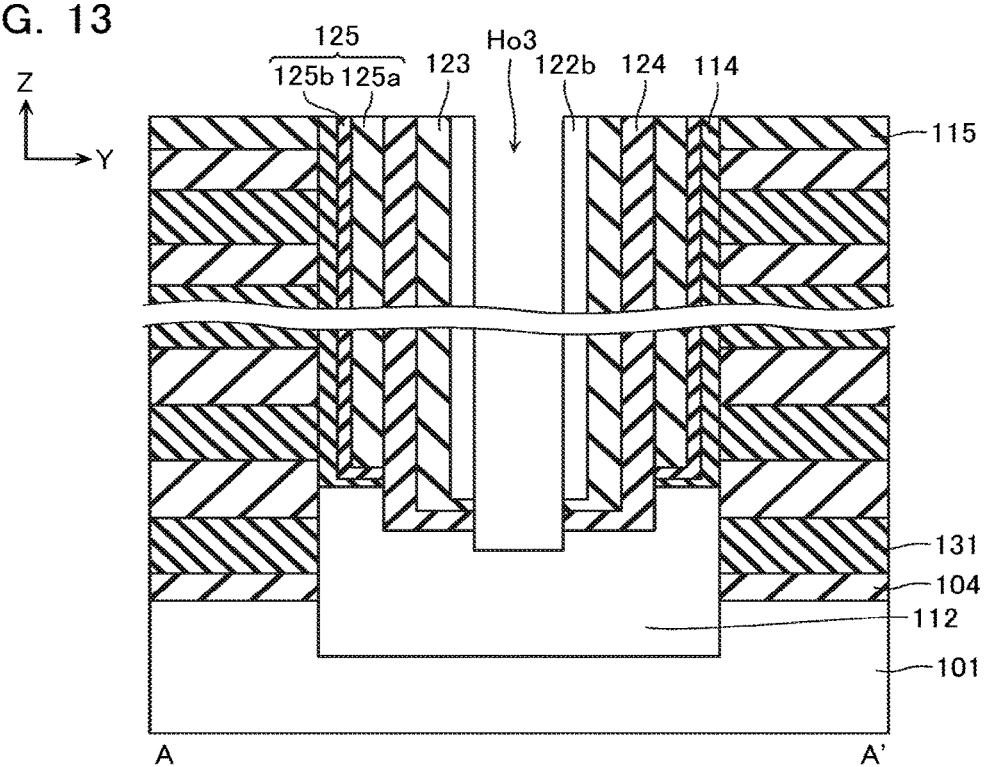

As shown in FIG. 13, parts of the charge accumulation layer 124, the tunnel insulating layer 123, and the second semiconductor layer 122b in a bottom part of the second hole Ho2 are removed by RIE or wet etching. At this time also, the surface of the epitaxial layer 112 sometimes gets further shaved. In this way, a third hole Ho3 is formed.

Figure 14:
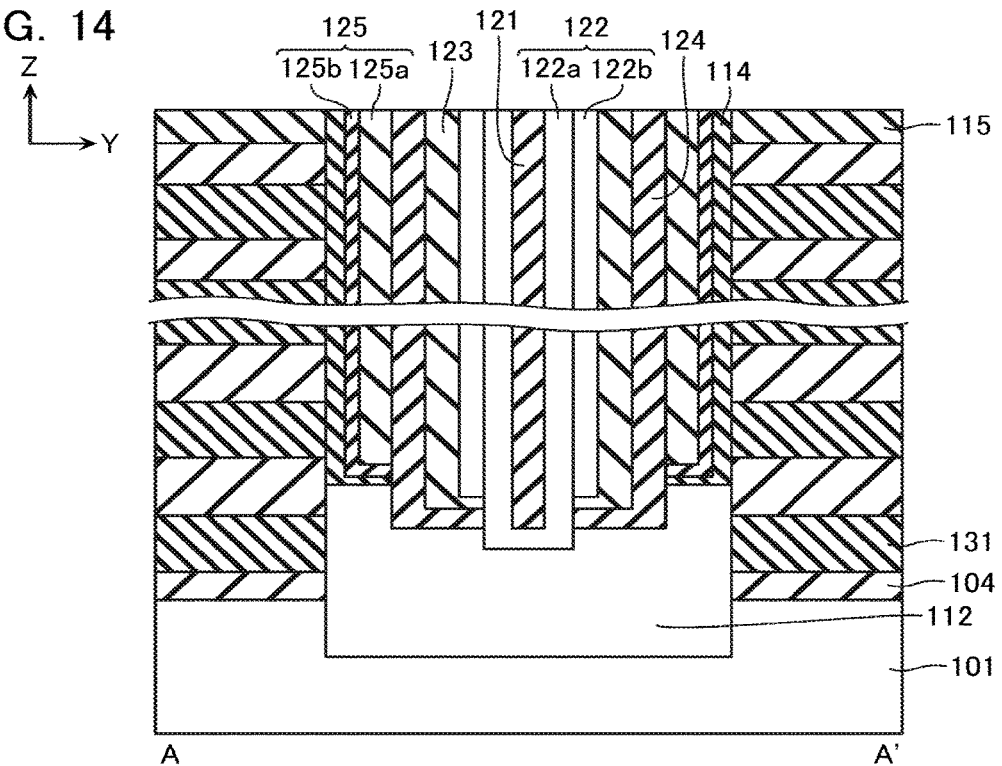

As shown in FIG. 14, the first semiconductor layer 122a and the core insulating layer 121 are sequentially deposited along an inner wall of the third hole Ho3. Note that sometimes, during deposition of the first semiconductor layer 122a, a surface on a first semiconductor layer 122a side of the second semiconductor layer 122b is slightly oxidized and a natural oxide film occurs, due to a deposition environment, and so on.

Figure 15:
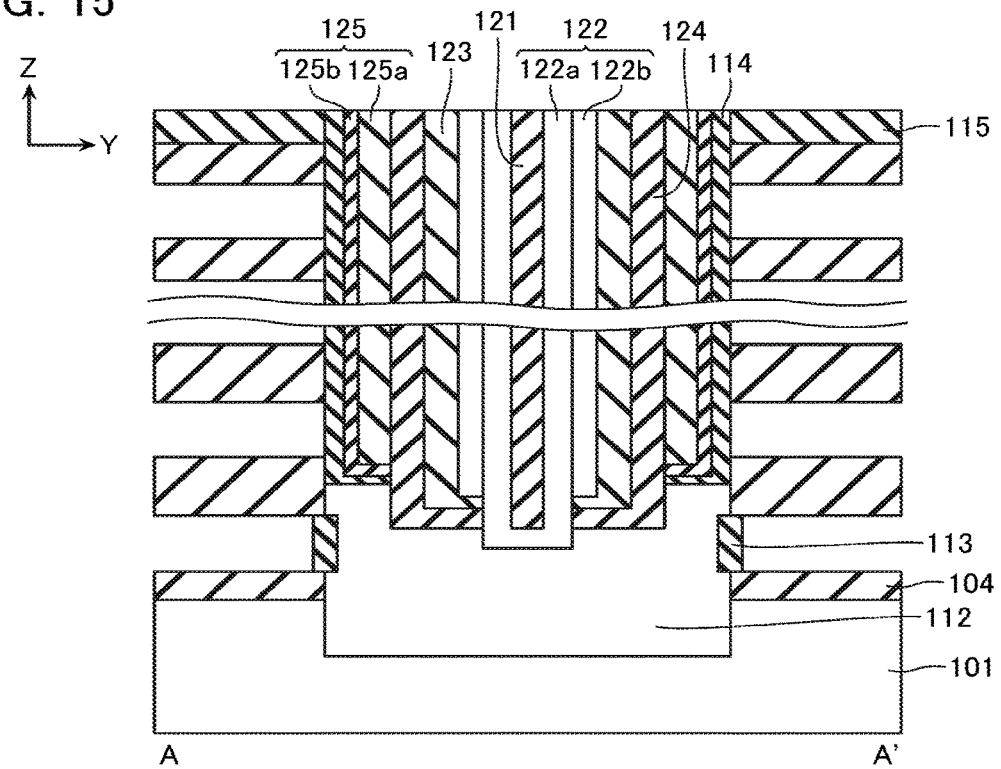

As shown in FIG. 15, the sacrifice layer 131 is removed by wet etching, via an unillustrated slit formed by lithography and RIE. When the sacrifice layer 131 is configured from silicon nitride, a phosphoric acid-based solution is employed as a chemical. At this time, the second block insulating layer 125b is protected from the phosphoric acid-based solution employed in the wet etching, by the cover film 114.

Figure 16:
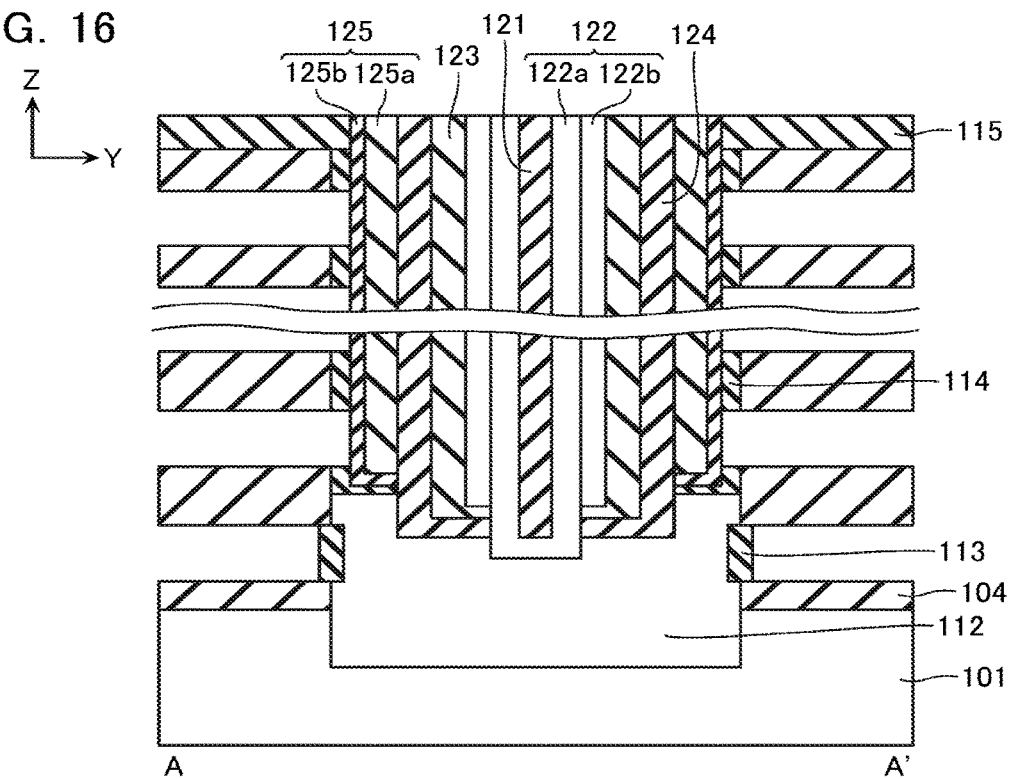

As shown in FIG. 16, the cover film 114 is removed by wet etching. When the cover film 114 is configured by silicon oxide or silicon, a hydrofluoric acid-based solution is employed as a chemical.

Finally, a metal film of the likes of tungsten is deposited by a CVD method in a gap created by removal of the sacrifice layer 131, whereby the conductive layer 102 is formed, and the configuration of FIG. 6 is obtained.

Note that after removal of the sacrifice layer 131 in the step of FIG. 15, part of a side surface of the epitaxial layer 112 is oxidized and the oxide film 113 is formed. Due to the oxide film 113, a short circuit between the lowermost layer conductive layer 102 and the epitaxial layer 112 is prevented. In the present embodiment, the oxide film 113 is shown in FIG. 15, that is, occurs in a step of FIG. 15 or before, but sometimes also occurs in a step of FIG. 15 or after.

In the present embodiment, as described above, by forming the second hole Ho2 after deposition of the block insulating layer 125 and before deposition of the charge accumulation layer 124, the high permittivity second block insulating layer 125b covers only the side surface of the charge accumulation layer 124 and never contacts the semiconductor layer 122. Therefore, it is possible to suppress the semiconductor layer 122 being oxidized, and a sufficient cell current can be secured.

Second Embodiment

A semiconductor memory device according to a second embodiment will be described using FIGS. 17 to 24. Note that in the embodiment below, configurations similar to those of the first embodiment will be assigned with identical reference symbols to those assigned in the first embodiment and descriptions thereof will be omitted. The same applies also to modified examples.

[Configuration]

Figure 17:
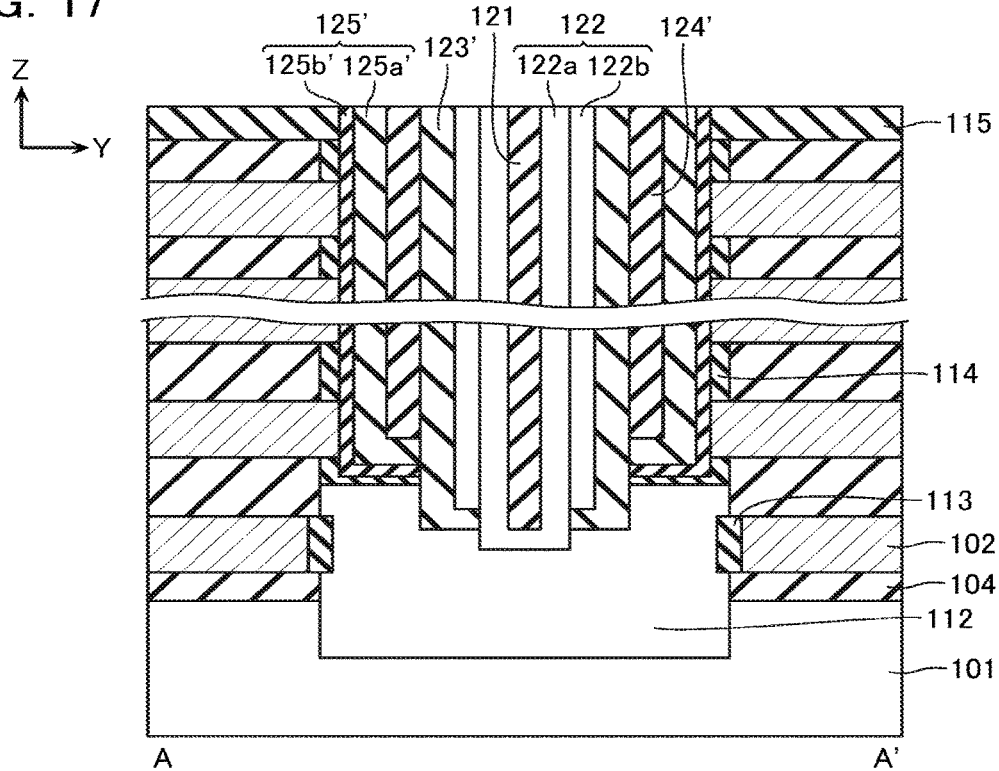
FIG. 17 is a schematic cross-sectional view showing a configuration of a semiconductor memory device according to a second embodiment.

FIG. 17 is a cross-sectional view showing a configuration of part of the semiconductor memory device according to the second embodiment, and corresponds to FIG. 6 in the first embodiment.

In the second embodiment, configurations of a tunnel insulating layer 123', a charge accumulation layer 124', and a block insulating layer 125' provided on the side surface of the semiconductor layer 122 are different from those in the first embodiment.

Specifically, as shown in FIG. 17, a bottom surface of the tunnel insulating layer 123' provided on the side surface of the semiconductor layer 122 contacts the epitaxial layer 112.

A lower end of the charge accumulation layer 124' provided on a side surface of the tunnel insulating layer 123' is positioned more upwardly than a lower end of the tunnel insulating layer 123'. Therefore, in the present embodiment, the charge accumulation layer 124' does not contact the semiconductor layer 122 and the epitaxial layer 112.

The block insulating layer 125' provided on a side surface of the charge accumulation layer 124' is configured from a first block insulating layer 125' a and a second block insulating layer 125'b. In the present embodiment, both the first block insulating layer 125'a and the second block insulating layer 125'b have their bottom parts protruding in a direction directed to the semiconductor layer 122 and have their lower ends positioned between the lower end of the charge accumulation layer 124' and the lower end of the tunnel insulating layer 123'. Therefore, the bottom parts of the first block insulating layer 125'a and the second block insulating layer 125'b contact a bottom surface of the charge accumulation layer 124' and the side surface of the tunnel insulating layer 123', and, similarly to in the first embodiment, do not contact the semiconductor layer 122.

In the present embodiment, as described above, in addition to the block insulating layer 125', the charge accumulation layer 124' also does not contact the semiconductor layer 122. Furthermore, the charge accumulation layer 124' does not contact the epitaxial layer 112 either. Therefore, generation of an electron trap between the charge accumulation layer 124' and the semiconductor layer 122 and between the charge accumulation layer 124' and the epitaxial layer 112 is suppressed, and deterioration of device characteristics is further prevented.

[Method of Manufacturing]

A method of manufacturing in the second embodiment is generally similar to the method of manufacturing in the first embodiment.

Specifically, it is similar to the first embodiment up to the step shown in FIG. 10.

Figure 18:
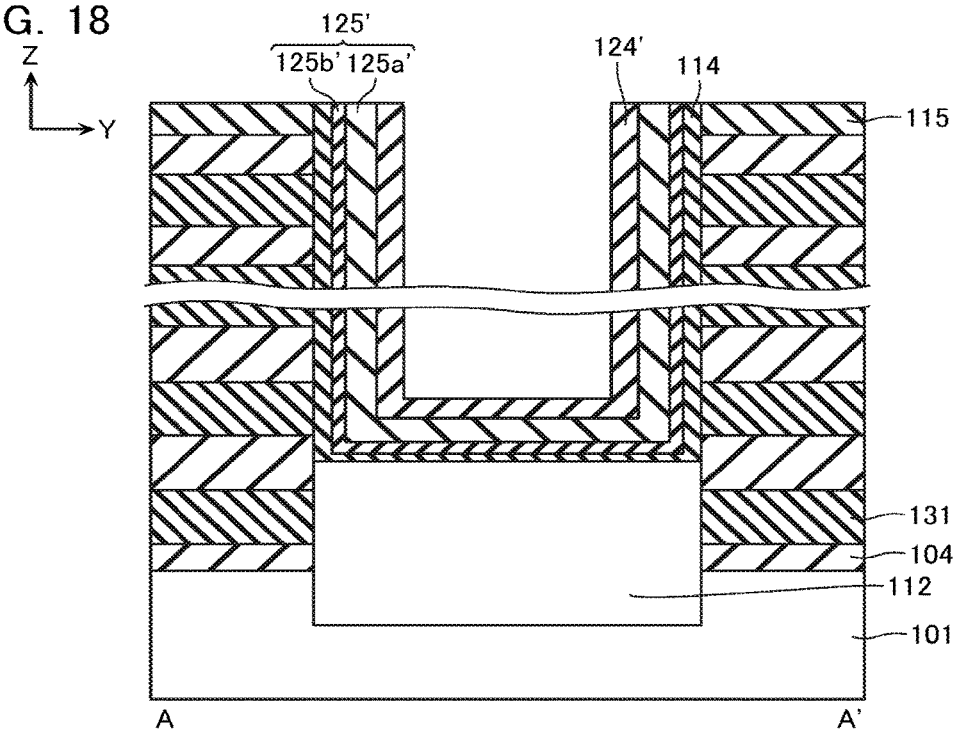
FIGS. 18 to 24 are schematic cross-sectional views showing a method of manufacturing the same semiconductor memory device.

In the present embodiment, as shown in FIG. 18, the charge accumulation layer 124' is deposited on the block insulating layer 125' without performing the likes of RIE.

Figure 19:
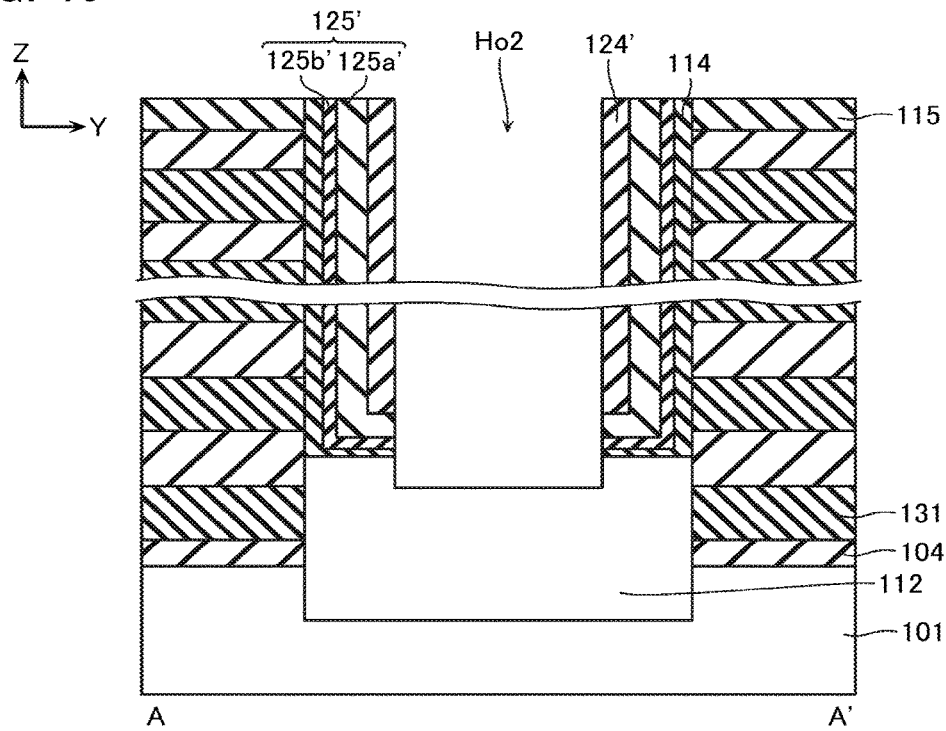

Then, as shown in FIG. 19, parts of the cover film 114, the second block insulating layer 125'b, the first block insulating layer 125'a, and the charge accumulation layer 124' in the bottom part of the first hole Ho1 are removed by RIE or wet etching, and the second hole Ho2 is formed.

Figure 20:
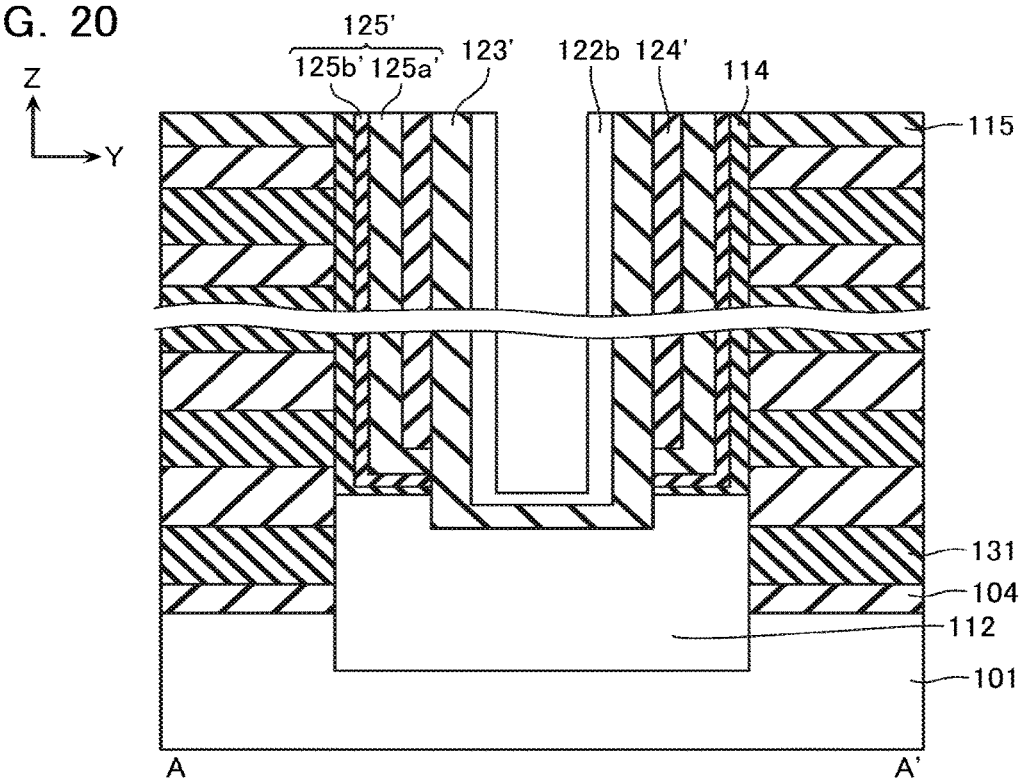

As shown in FIG. 20, the tunnel insulating layer 123' and the second semiconductor layer 122b are sequentially deposited along the inner wall of the second hole Ho2.

Figure 21:
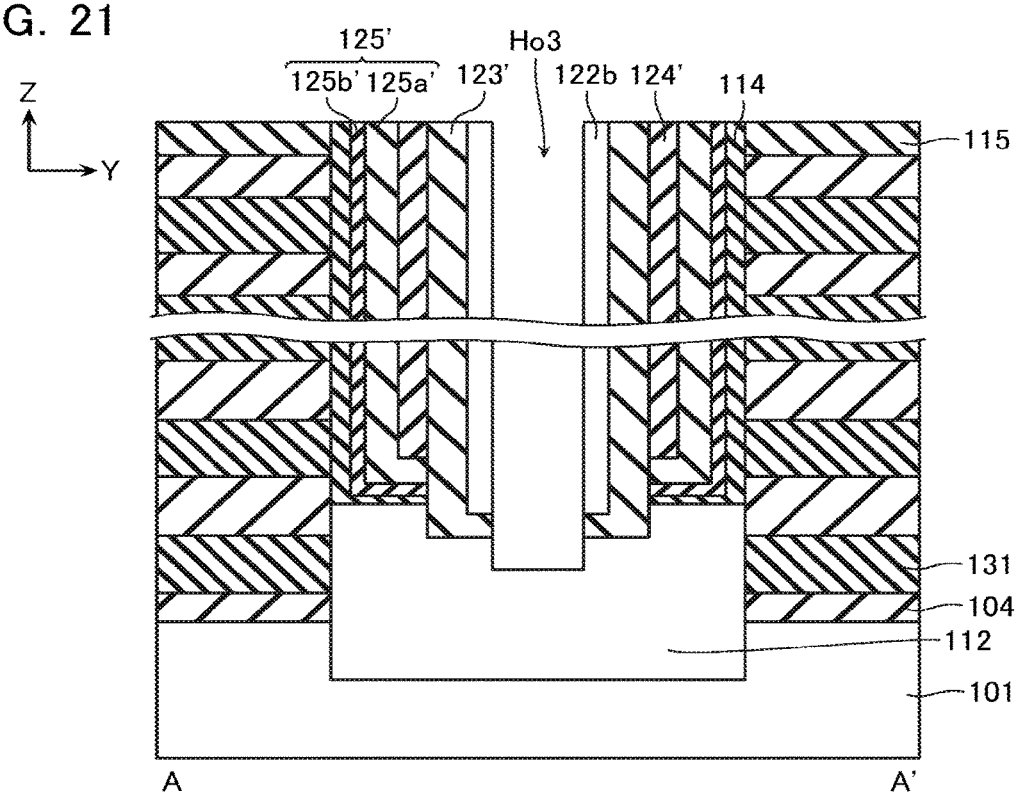

As shown in FIG. 21, the tunnel insulating layer 123' and the second semiconductor layer 122b in the bottom part of the second hole Ho2 are removed by RIE or wet etching, and the third hole Ho3 is formed.

Figure 22:
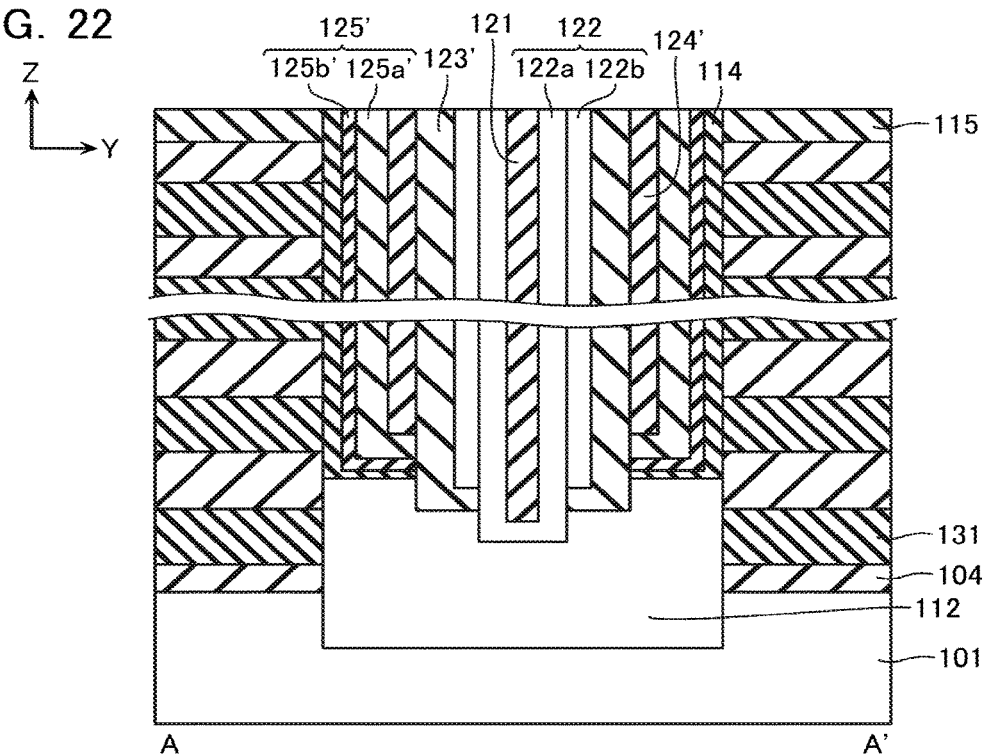

As shown in FIG. 22, the first semiconductor layer 122a and the core insulating layer 121 are sequentially deposited along the inner wall of the third hole Ho3.

Figure 23:
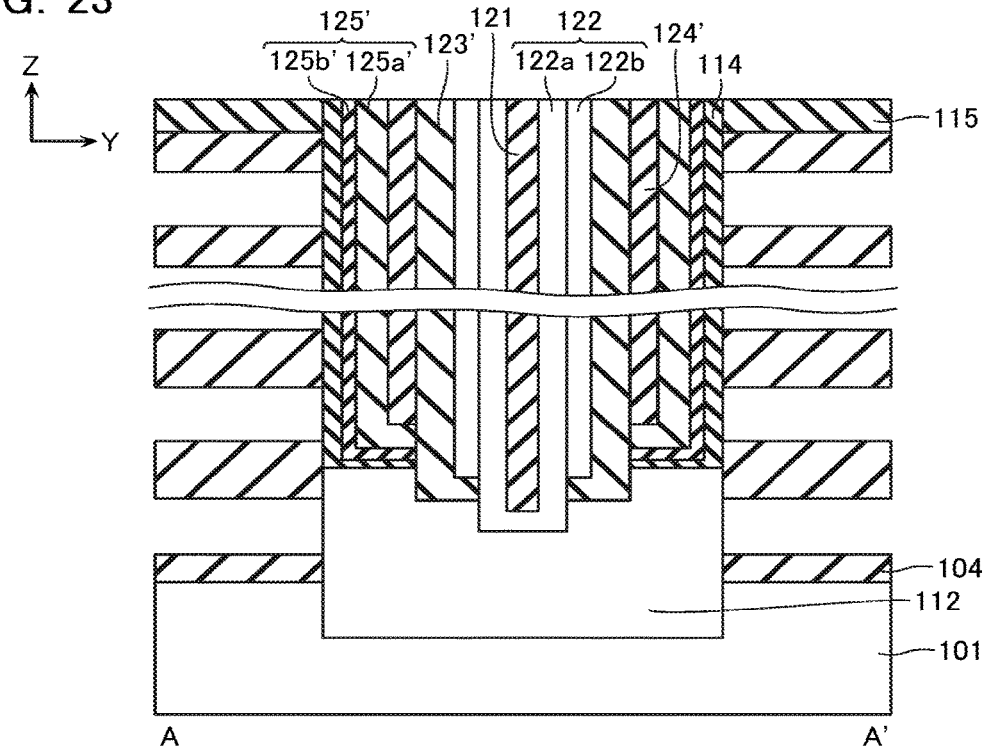

As shown in FIG. 23, the sacrifice layer 131 is removed by wet etching, via an unillustrated slit formed by lithography and RIE.

Figure 24:
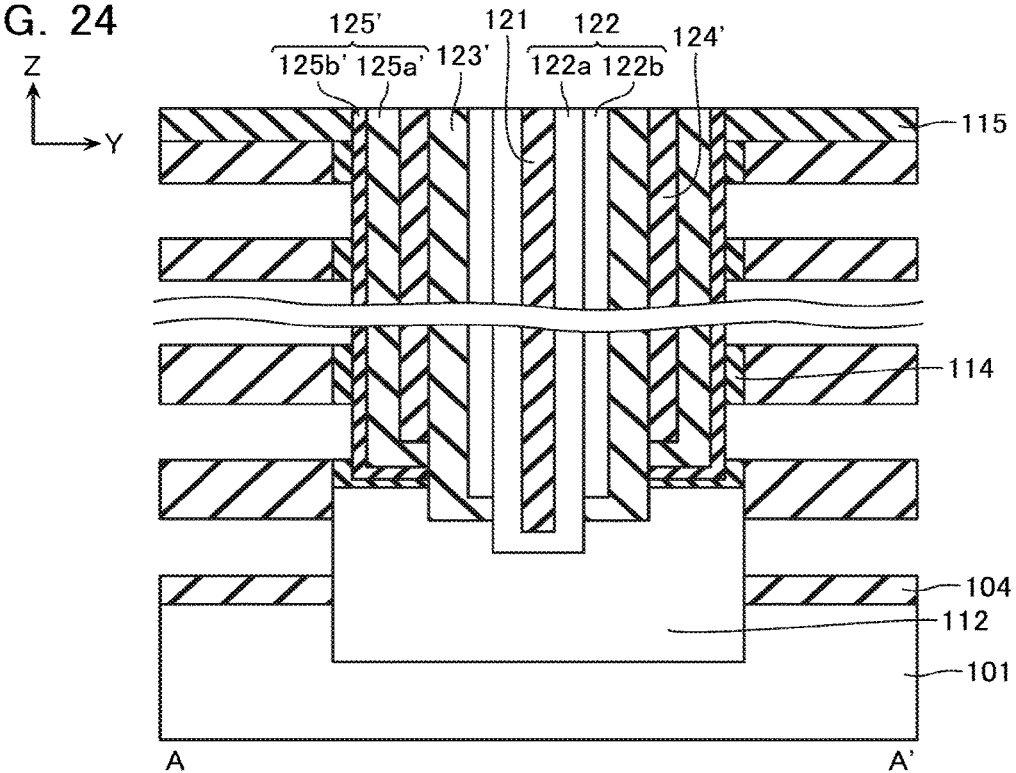

As shown in FIG. 24, the cover film 114 is removed by wet etching.

Finally, a metal film of the likes of tungsten is deposited by a CVD method in the gap created by removal of the sacrifice layer 131, whereby the conductive layer 102 is formed, and the configuration of FIG. 17 is obtained.

In such a way, in the present embodiment, after formation of the first hole Ho1, the first one of the RIEs is performed after depositing up to the charge accumulation layer 124' in the first hole Ho1, and parts of the cover film 114, the second block insulating layer 125'b, the first block insulating layer 125'a, and the charge accumulation layer 124' in the bottom part of the first hole Ho1 are removed. As a result, a shape and position of the bottom part of the charge accumulation layer 124' is different from in the first embodiment, and the charge accumulation layer 124' ceases to contact the semiconductor layer 122.

Modified Examples

Figure 25:
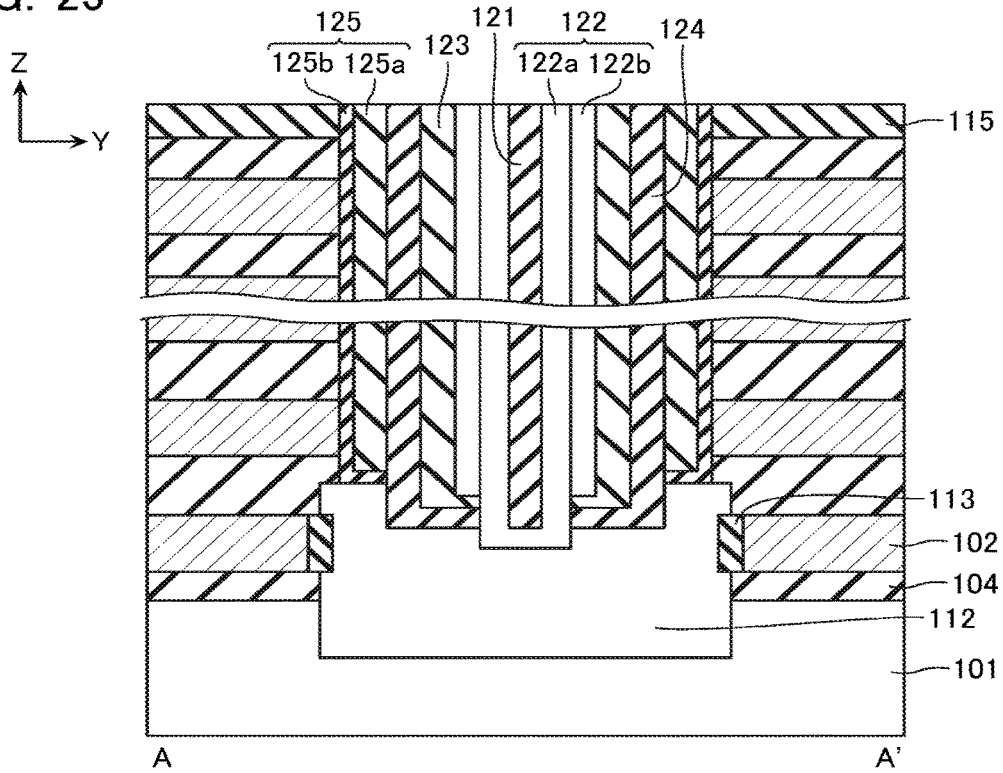
FIGS. 25 and 26 are schematic cross-sectional views each showing a configuration of a semiconductor memory device according to a modified example.
Figure 26:
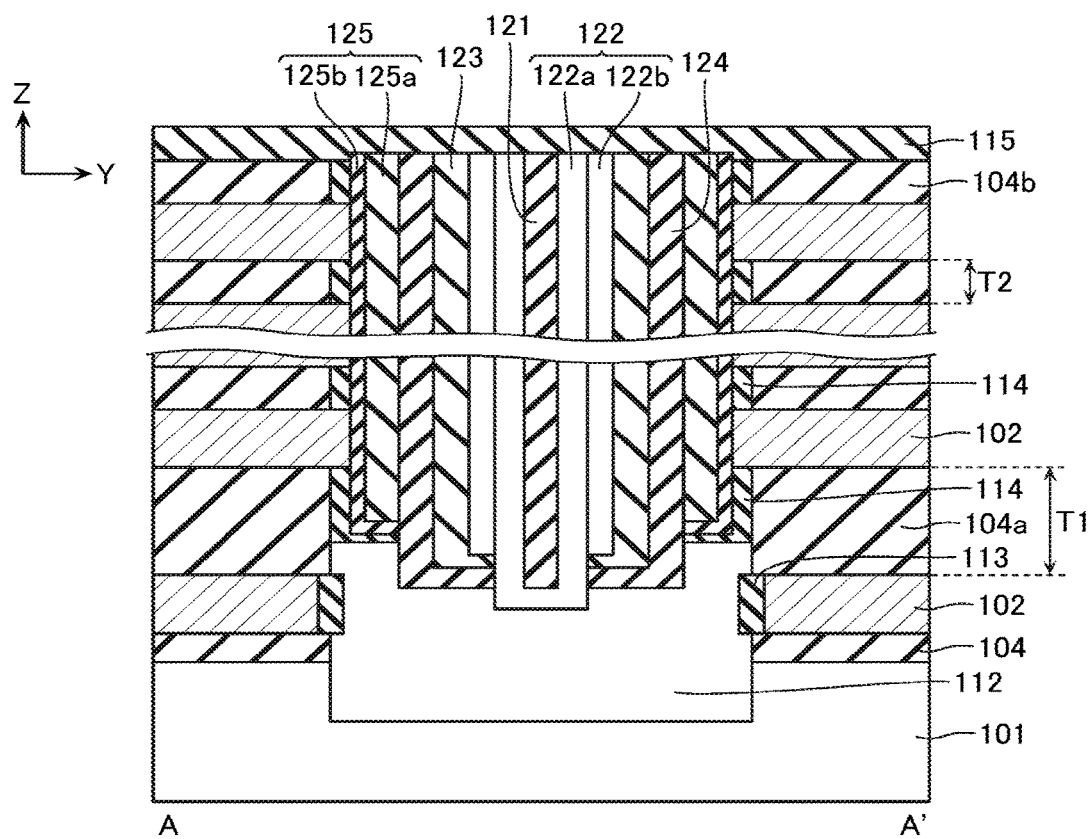

Semiconductor memory devices according to several modified examples will be described using FIGS. 25 and 26.

In the above embodiments, the cover film 114 protecting the second block insulating layer 125b (125'b) was provided when removing the sacrifice layer 131 by wet etching using the phosphoric acid-based solution. However, if the second block insulating layer 125b (125'b) is more highly selective than the sacrifice layer 131 with respect to phosphoric acid, then this second block insulating layer 125b (125'b) also functions as the cover film, hence in the modified example shown in FIG. 25, the cover film 114 is not provided.

In addition, the lowermost layer conductive layer 102 is employed as a source side select gate electrode. The select gate electrode is usually applied with a higher voltage than the word line WL. Therefore, it ends up becoming easier for parasitic capacitance to be generated between the select gate electrode and the word line WL. To prevent such a risk, as shown in FIG. 26, an average thickness T1 of an inter-layer insulating layer 104a between the lowermost layer conductive layer 102 and the second of the conductive layers 102, that is, of the second of the inter-layer insulating layers 104a counting from a substrate 101 side, is configured larger than an average thickness T2 of another inter-layer insulating layer 104b. Now, the average thickness of the inter-layer insulating layer 104 refers to an average thickness over the entire layer.

In the above embodiments, the charge accumulation layer 124 contacts the semiconductor layer 122 similarly to in the first embodiment, but a configuration in which the charge accumulation layer does not contact the semiconductor layer as in the second embodiment may also be adopted. Moreover, it is of course possible to combine fellow modified examples.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a semiconductor substrate;
a semiconductor layer provided above the semiconductor substrate and extending in a first direction intersecting a main surface of the semiconductor substrate;
a first insulating layer provided on a side surface of the semiconductor layer;
a charge accumulation layer provided on a side surface of the first insulating layer;
a block insulating layer provided on a side surface of the charge accumulation layer; and a plurality of conductive layers stacked in the first direction via a plurality of insulating layers, in a periphery of the block insulating layer, wherein the block insulating layer continuously extends in the first direction along the plurality of conductive layers, the block insulating layer including:

a first block insulating layer and a second block insulating layer that has a permittivity which is higher than that of the first block insulating layer, and a lower end of the second block insulating layer being positioned more upwardly than a lower end of the first insulating layer.

2. The semiconductor memory device according to claim 1, wherein the semiconductor layer is configured from:

a first semiconductor layer extending in the first direction; and a second semiconductor layer covering a side surface of the first semiconductor layer, a lower end of the second semiconductor layer being positioned more upwardly than a lower end of the first semiconductor layer.

3. The semiconductor memory device according to claim 2, wherein an interface of the first semiconductor layer and the second semiconductor layer includes oxygen atoms.

4. The semiconductor memory device according to claim 1, wherein a lower end of the charge accumulation layer is positioned more downwardly than a lower end of the block insulating layer and more downwardly than the lower end of the first insulating layer.

5. The semiconductor memory device according to claim 4, wherein the charge accumulation layer is configured from:

a first portion extending in the first direction to cover the side surface of the first insulating layer, the first insulating layer being a tunnel insulating layer; and a second portion projecting in a direction directed from a lower end of the first portion to the semiconductor layer, an end of the second portion contacting the semiconductor layer.

6. The semiconductor memory device according to claim 1, wherein a lower end of the charge accumulation layer is positioned more upwardly than a lower end of the block insulating layer.

7. The semiconductor memory device according to claim 6, wherein the block insulating layer is configured from:

a first portion extending in the first direction to cover the side surface of the charge accumulation layer; and a second portion projecting in a direction directed from a lower end of the first portion to the semiconductor layer, an end of the second portion contacting the first insulating layer, the first insulating layer being a tunnel insulating layer.

8. The semiconductor memory device according to claim 1, further comprising an epitaxial layer provided on the semiconductor substrate, wherein the semiconductor layer, the first insulating layer, the charge accumulation layer, and the block insulating layer are provided on the epitaxial layer, the first insulating layer being a tunnel insulating layer.

9. The semiconductor memory device according to claim 8, wherein an upper surface of the epitaxial layer is positioned between an upper surface of a first layer of the plurality of conductive layers which is the first closest to the semiconductor substrate and a lower surface of a second layer of the plurality of conductive layers which is the second closest to the semiconductor substrate.

10. The semiconductor memory device according to claim 9, wherein a second insulating layer is provided between the first layer of the plurality of conductive layers and the epitaxial layer.

11. The semiconductor memory device according to claim 8, wherein a surface of the epitaxial layer has a stepped shape whose height becomes lower from an outer side to an inner side.

12. The semiconductor memory device according to claim 1, wherein the plurality of insulating layers are stacked above the semiconductor substrate in the first direction with the plurality of conductive layers interposed therebetween, the plurality of insulating layers including a third insulating layer which is the second closest to the semiconductor substrate, an average thickness of the third insulating layer is greater than an average thickness of another insulating layer of the plurality of insulating layers stacked in the first direction.

13. The semiconductor memory device according to claim 1, wherein the first block insulating layer is a silicon oxide layer.

14. The semiconductor memory device according to claim 1, wherein the second block insulating layer includes Hf, Al, Zr, Ti, or Ta.

15. The semiconductor memory device according to claim 2, wherein no block insulating layer directly contacts the first and second semiconductor layers.

* * * * *